(12) United States Patent
Striemer et al.

(10) Patent No.: US 7,922,795 B2
(45) Date of Patent: Apr. 12, 2011

(54) ULTRATHIN NANOSCALE MEMBRANES, METHODS OF MAKING, AND USES THEREOF

(75) Inventors: Christopher C. Striemer, Rochester, NY (US); Philippe M. Fauchet, Pittsford, NY (US)

(73) Assignee: University of Rochester, Rochester, NY (US)

( * ) Notice: Subject to any disclaimer, the term of this patent is extended or adjusted under 35 U.S.C. 154(b) by 1120 days.

(21) Appl. No.: 11/415,014

(22) Filed: May 1, 2006

(65) Prior Publication Data

US 2006/0243655 A1 Nov. 2, 2006

Related U.S. Application Data

(60) Provisional application No. 60/676,375, filed on Apr. 29, 2005.

(51) Int. Cl.
*B01D 53/22* (2006.01)

(52) U.S. Cl. ............... 96/4; 96/5; 96/6; 96/7; 96/8; 96/9; 96/10; 96/11; 96/12; 96/13; 96/14; 95/54; 95/55; 95/56; 210/500.21; 210/500.25; 210/500.27; 210/640

(58) Field of Classification Search ........... 95/54–56; 96/4–14; 210/500.21, 500.25, 500.27, 640
See application file for complete search history.

(56) References Cited

U.S. PATENT DOCUMENTS

| | | | |
|---|---|---|---|
| 4,191,182 A | | 3/1980 | Popovich et al. |
| 4,329,157 A | * | 5/1982 | Dobo et al. ............. 95/56 |
| 4,557,995 A | * | 12/1985 | Broers et al. ............. 430/296 |
| 4,784,721 A | | 11/1988 | Holmen et al. |
| 4,824,568 A | | 4/1989 | Allegrezza, Jr. et al. |
| 5,334,314 A | | 8/1994 | Neel et al. |
| 5,342,432 A | * | 8/1994 | Haubs et al. ............. 95/47 |
| 5,354,695 A | * | 10/1994 | Leedy ............. 438/411 |
| 5,413,679 A | * | 5/1995 | Godbey ............. 438/702 |
| 5,503,657 A | * | 4/1996 | Bouard et al. ............. 95/45 |
| 5,552,046 A | | 9/1996 | Johnston et al. |
| 5,567,302 A | | 10/1996 | Song et al. |
| 5,595,646 A | * | 1/1997 | Foos et al. ............. 205/783 |
| 5,753,014 A | | 5/1998 | Van Rijn et al. |
| 5,904,545 A | | 5/1999 | Smith et al. |

(Continued)

FOREIGN PATENT DOCUMENTS

DE 10353894 A1 2/2005

(Continued)

OTHER PUBLICATIONS

Chen et al., "Large On-off Ratios and Negative Differential Resistance in a Molecular Electronic Device," *Science* 286:1550-1552 (1999).

(Continued)

*Primary Examiner* — Jason M Greene
*Assistant Examiner* — Dung Bui
(74) *Attorney, Agent, or Firm* — LeClairRyan

(57) ABSTRACT

A nanoscale membrane exposed on opposite sides thereof and having an average thickness of less than about 100 nm, and a lateral length to thickness aspect ratio that is more than 10,000 to 1 is disclosed. Also disclosed are methods of making such membranes, and use thereof in a number of devices including fuel cells, sensor devices, electrospray devices, and supports for examining a sample under electron microscopy.

32 Claims, 9 Drawing Sheets

U.S. PATENT DOCUMENTS

| | | | |
|---|---|---|---|
| 5,948,470 A | 9/1999 | Harrison et al. | |
| 6,017,773 A * | 1/2000 | Fauchet et al. | 438/22 |
| 6,039,877 A | 3/2000 | Chevallet et al. | |
| 6,120,875 A * | 9/2000 | Haumont et al. | 428/131 |
| 6,332,914 B1 * | 12/2001 | Lee | 95/55 |
| 6,399,234 B2 | 6/2002 | Bonk et al. | |
| 6,406,605 B1 | 6/2002 | Moles | |
| 6,454,938 B2 | 9/2002 | Moon et al. | |
| 6,517,994 B2 | 2/2003 | Watanabe | |
| 6,536,604 B1 * | 3/2003 | Brinker et al. | 210/490 |
| 6,780,786 B2 * | 8/2004 | Dougherty | 438/758 |
| 6,811,037 B2 * | 11/2004 | Hintsche | 210/490 |
| 6,899,744 B2 * | 5/2005 | Mundschau | 95/56 |
| 6,946,015 B2 * | 9/2005 | Jorgensen et al. | 95/51 |
| 7,112,287 B2 * | 9/2006 | Yagi et al. | 216/56 |
| 7,141,096 B2 * | 11/2006 | Carboneri et al. | 96/4 |
| 7,282,148 B2 * | 10/2007 | Dalton et al. | 210/500.25 |
| 7,393,392 B2 * | 7/2008 | Yamaguchi et al. | 96/11 |
| 7,410,531 B2 * | 8/2008 | Edlund et al. | 96/4 |
| 7,425,231 B2 * | 9/2008 | Carolan et al. | 95/54 |
| 7,485,233 B2 * | 2/2009 | Vane et al. | 210/660 |
| 7,662,218 B2 * | 2/2010 | Maeda et al. | 96/4 |
| 2003/0096424 A1 | 5/2003 | Mao et al. | |
| 2003/0162399 A1 | 8/2003 | Singh | |
| 2003/0183080 A1 * | 10/2003 | Mundschau | 95/55 |
| 2003/0205138 A1 * | 11/2003 | Edlund et al. | 96/4 |
| 2003/0217966 A1 * | 11/2003 | Tapsak et al. | 210/500.21 |
| 2003/0222012 A1 * | 12/2003 | Lee et al. | 210/321.84 |
| 2003/0222015 A1 * | 12/2003 | Oyama et al. | 210/500.21 |
| 2004/0035782 A1 * | 2/2004 | Muller | 210/490 |
| 2004/0063322 A1 | 4/2004 | Yang | |
| 2004/0129135 A1 * | 7/2004 | Roark et al. | 95/55 |
| 2004/0154641 A1 | 8/2004 | Montierth | |
| 2004/0187558 A1 * | 9/2004 | Dye et al. | 73/31.07 |
| 2004/0244591 A1 * | 12/2004 | Edlund et al. | 96/11 |
| 2004/0245191 A1 * | 12/2004 | Yagi et al. | 210/791 |
| 2005/0082641 A1 | 4/2005 | Leedy | |
| 2005/0084792 A1 | 4/2005 | Yokoi et al. | |
| 2005/0092676 A1 * | 5/2005 | Dalton et al. | 210/500.26 |
| 2005/0188843 A1 * | 9/2005 | Edlund et al. | 96/4 |
| 2005/0229786 A1 * | 10/2005 | Wetzig | 96/4 |
| 2005/0241477 A1 * | 11/2005 | Mundschau et al. | 95/56 |
| 2005/0242022 A1 * | 11/2005 | Kang et al. | 210/500.25 |
| 2005/0268782 A1 * | 12/2005 | Kulkarni et al. | 96/4 |
| 2005/0284814 A1 * | 12/2005 | Mairal et al. | 210/644 |
| 2006/0012086 A1 * | 1/2006 | Munch-Laursen et al. | 264/601 |
| 2006/0016332 A1 * | 1/2006 | Ma et al. | 95/55 |
| 2006/0049101 A1 * | 3/2006 | Suib et al. | 210/500.21 |
| 2006/0108714 A1 * | 5/2006 | Pedersen et al. | 264/443 |
| 2006/0173259 A1 * | 8/2006 | Flaherty et al. | 600/331 |
| 2006/0175249 A1 * | 8/2006 | Vane et al. | 210/502.1 |
| 2006/0213368 A1 * | 9/2006 | Kita et al. | 96/4 |
| 2006/0230937 A1 * | 10/2006 | Smirnov et al. | 96/11 |
| 2006/0231484 A1 * | 10/2006 | Haring et al. | 210/500.27 |
| 2006/0231485 A1 * | 10/2006 | Yoshinaga et al. | 210/500.39 |
| 2006/0237360 A1 * | 10/2006 | Mizuno et al. | 210/490 |
| 2006/0273004 A1 * | 12/2006 | Kang et al. | 210/500.25 |
| 2006/0278580 A1 * | 12/2006 | Striemer et al. | 210/650 |
| 2006/0289351 A1 * | 12/2006 | Xiao et al. | 210/500.25 |
| 2007/0029256 A1 * | 2/2007 | Nakano et al. | 210/641 |
| 2007/0039471 A1 * | 2/2007 | Hofmann | 96/4 |
| 2007/0079703 A1 * | 4/2007 | Carolan et al. | 96/4 |
| 2007/0163437 A1 * | 7/2007 | Ikeda et al. | 96/4 |
| 2008/0178736 A1 * | 7/2008 | Carolan et al. | 95/54 |
| 2008/0245735 A1 * | 10/2008 | Hennige et al. | 210/650 |

FOREIGN PATENT DOCUMENTS

| | | |
|---|---|---|
| EP | 1611941 A2 | 4/2006 |
| WO | 2005/007276 A1 | 1/2005 |

OTHER PUBLICATIONS

Jirage et al., "Nanotubule-based Molecular-filtration Membranes," *Science* 278:655-658 (1997).

Kuo et al., "Hybrid Three-dimensional Nanofluidic/Microfluidic Devices Using Molecular Gates," *Sensors and Actuators A* 102:223-233 (2003).

Létant et al., "Functionalized Silicon Membranes for Selective Bio-organism Capture," *Nat. Mater.* 2:391-395, suppl'y inform. 1 (2003).

Li et al., "Ion-beam Sculpting at Nanometre Length Scales," *Nature* 412:166-169 (2001).

Schmuhl et al., "Si-compatible Ion Selective Oxide Interconnects with High Tunability," *Adv. Mater.* 16(11):900-904 (2004).

Storm et al., "Fabrication of Solid-state Nanopores with Single-nanometre Precision," *Nat. Mater.* 2:537-540, suppl'y inform. 1 (2003).

Tong et al., "Silicon Nitride Nanosieve Membrane," *Nano Lett.* 4(2):283-287 (2004).

Ko et al., "A Polymer-based Microfluidic Device for Immunosensing Biochips," *Lab Chip* 3:106-113 (2003).

Környei et al., "Humoral and Contact Interactions in Astroglia/Stem Cell Co-cultures in the Course of Glia-Induced Neurogenesis," *GLIA* 49:430-444 (2005).

Lee et al., "Antibody-Based Bio-Nanotube Membranes for Enantiomeric Drug Separations," *Science* 296:2198-2200 (2002).

Liao et al., "Use of Electrochemical DNA Biosensors for Rapid Molecular Identification of Uropathogens in Clinical Urine Specimens," *J. Clin. Microbiol.* 44(2) 561-570 (2006).

Midwood et al., "Easy and Efficient Bonding of Biomolecules to an Oxide Surface of Silicon," *Langmuir* 20:5501-5505 (2004).

Ma et al., "An Endothelial and Astrocyte Co-culture Model of the Blood-brain Barrier Utilizing an Ultra-thin, Nanofabricated Silicon Nitride Membrane," Lab Chip 5:74-85 (2005).

Striemer, "Applications of Silicon Nanostructures Compatible with Existing Manufacturing Technology," University of Rochester, Department of Electrical and Computer Engineering 1-136 (2004).

Chen et al., "Enhancement of Electron Mobility in Nanocrystalline Silicon/Crystalline Silicon Heterostructures," *J. Applied Phys.* 97:024305 (2005).

Office Action dated May 11, 2009, in U.S. Appl. No. 11/414,991.

Office Action dated Oct. 28, 2008, in U.S. Appl. No. 11/414,991.

Reisman et al., "The Controlled Etching of Silicon in Catalyzed Ethylenediamine-Pyrocatechol-Water Solutions," *J Electrochem. Soc.* 126(8):1406-1415 (1979).

Grom et al., "Ordering and Self-Organization in Nanocrystalline Silicon," *Nature* 407:358-361 (2000).

* cited by examiner

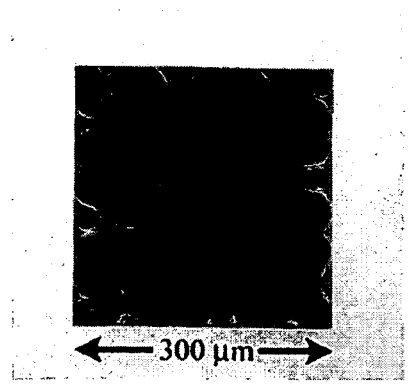
FIGURE 4A
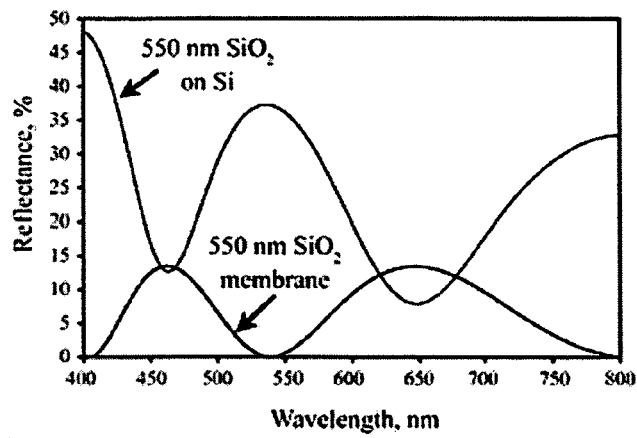
FIGURE 4B
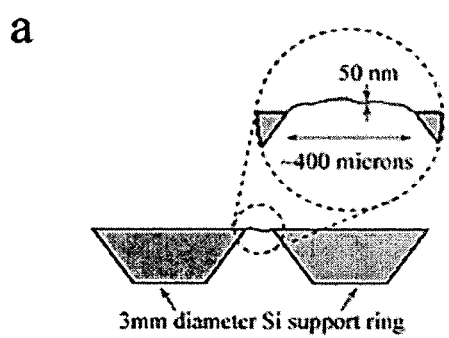
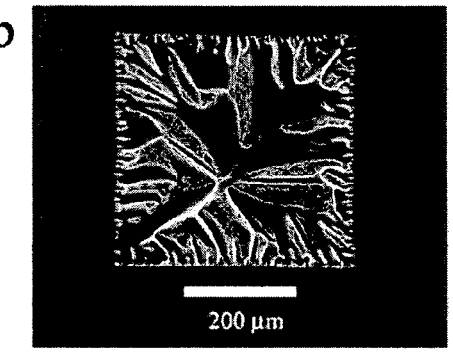
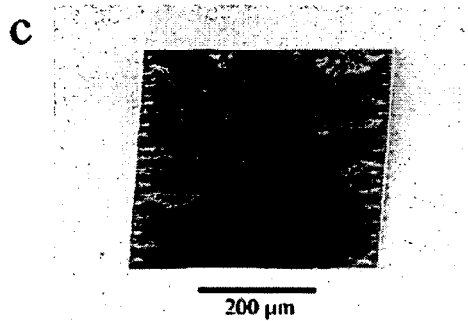
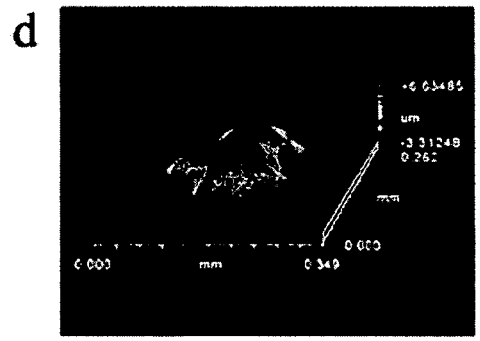
FIGURES 5A-D

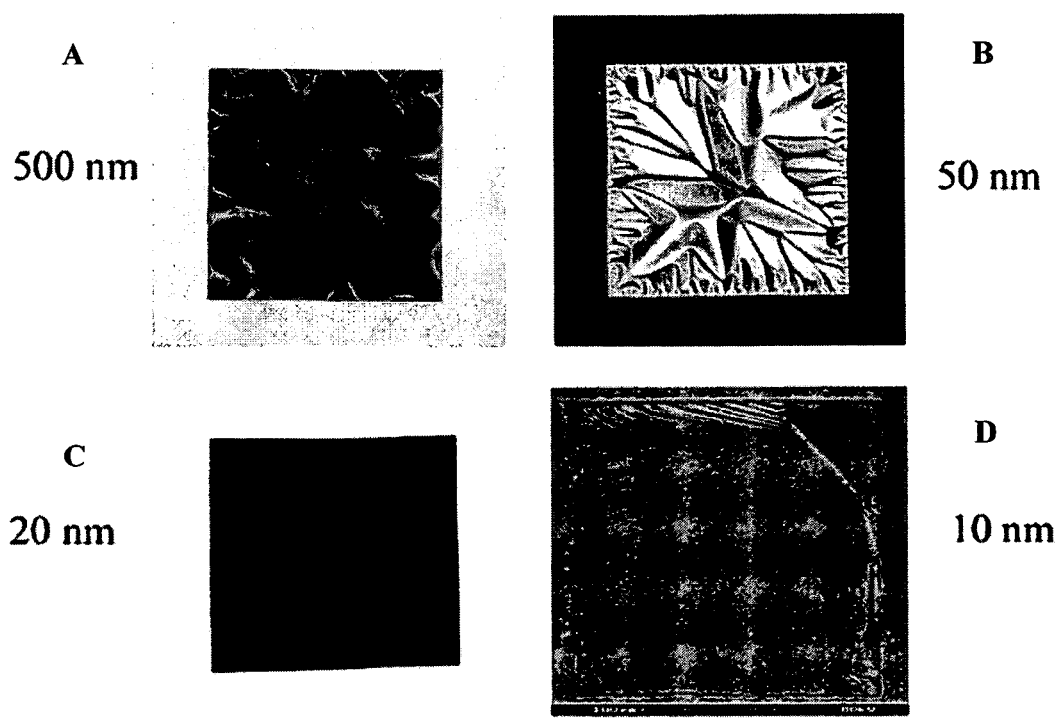
FIGURES 6A-D

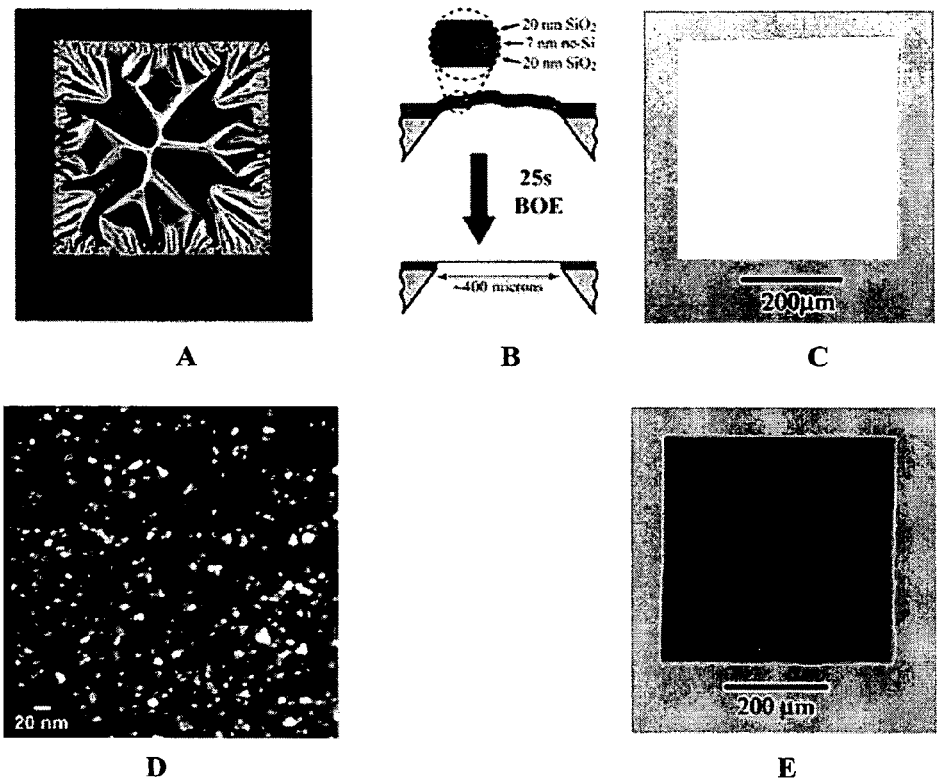
FIGURES 7A-E
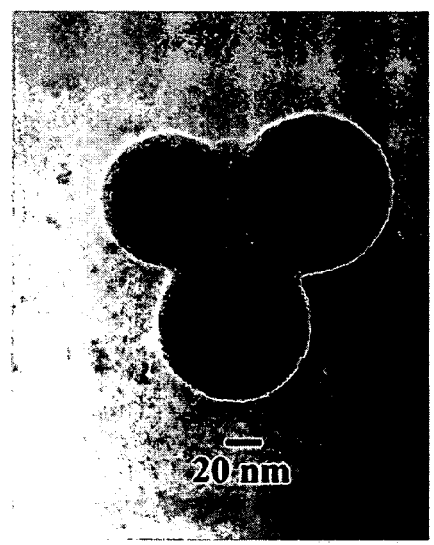
FIGURE 8A
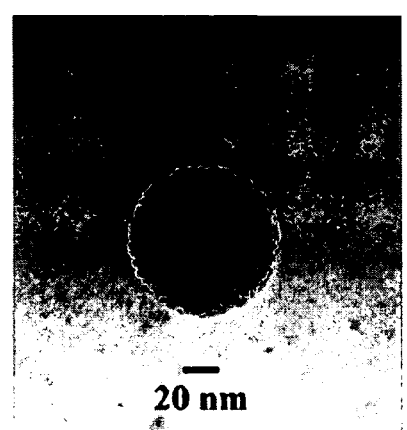
FIGURE 8B bright-field (transmission)

dark-field (diffraction)

50 nm thick 20 nm thick 7 nm thick

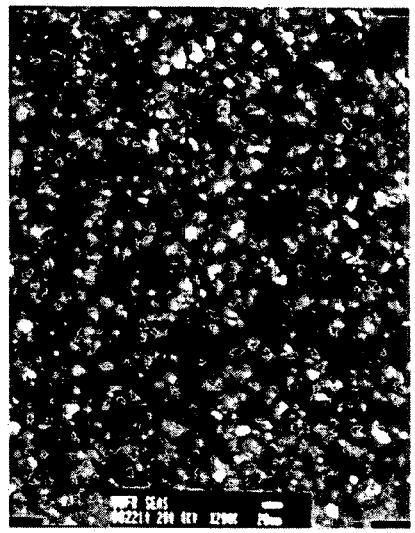
RTP + furnace anneal
FIGURE 11A
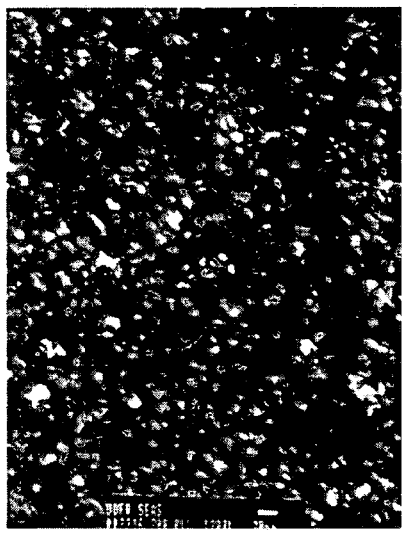
RTP only
FIGURE 11B
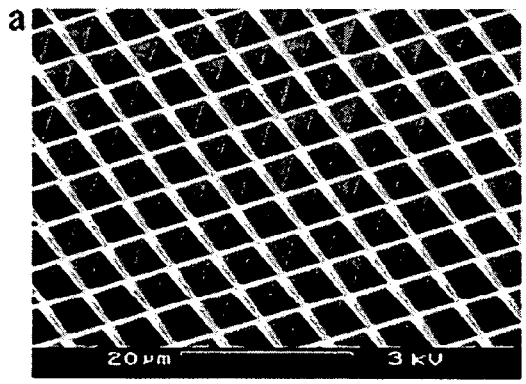
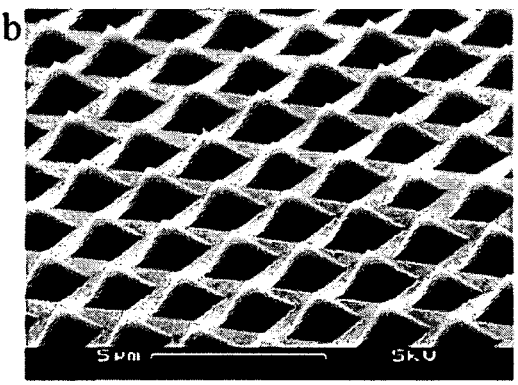
FIGURES 12A-B

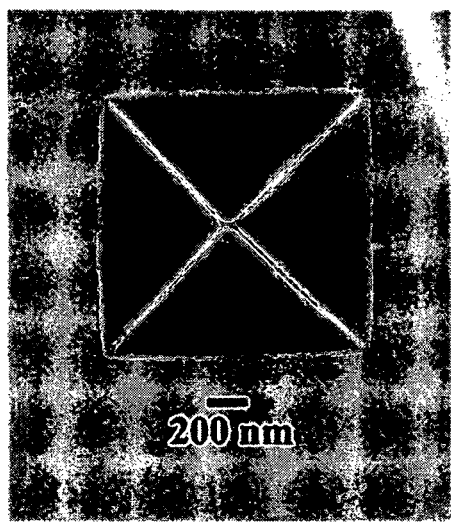 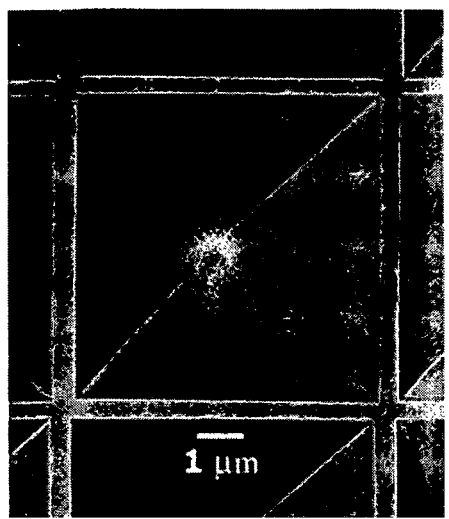
85 nm thermal oxide | 100 nm sputtered oxide
FIGURE 13A | FIGURE 13B

US 7,922,795 B2

ULTRATHIN NANOSCALE MEMBRANES, METHODS OF MAKING, AND USES THEREOF

This application claims the benefit of U.S. Provisional Patent Application Ser. No. 60/676,375 filed Apr. 29, 2005, which is hereby incorporated by reference in its entirety.

FIELD OF THE INVENTION

The present invention is directed to ultrathin nanoscale membranes, methods of making the membranes, and uses thereof.

BACKGROUND OF THE INVENTION

Nearly all reported ultrathin microfabricated membranes are made of silicon nitride (SiN) (Deshmukh et al., "Nanofabrication Using a Stencil Mask," *Appl Phys Lett* 75:1631-1633 (1999); and Toh et al., "Fabrication of Free-Standing Nanoscale Alumina Membranes with Controllable Pore Aspect Ratios," *Nano Lett* 4:767-770 (2004)). This is because it is well known that the most commonly available anisotropic silicon etchant, potassium hydroxide (KOH), will not attack SiN. Therefore, a very large thickness of silicon (substrate) can be etched away while leaving a very small thickness of SiN, enabling the formation of thin membranes. Although SiN is an excellent material choice for many applications, having no simple alternatives limits process design flexibility.

Therefore, it would be desirable to develop a method for making ultrathin membranes, where the method can be used to fabrication ultrathin membranes formed of various materials.

The present invention is directed to overcoming this and other deficiencies in the art.

SUMMARY OF THE INVENTION

A first aspect of the present invention relates to a nanoscale membrane exposed on opposite sides thereof and having an average thickness of less than about 100 nm, and a lateral length to thickness aspect ratio that is more than 10,000 to 1.

A second aspect of the present invention relates to a structure that includes: a support having at least one passage extending between opposite surfaces of the support; and at least one nanoscale membrane according to the first aspect of the invention bound at its outer edges to the support, wherein each of the at least one nanoscale membranes confronts a passage.

A third aspect of the present invention relates to a fuel cell that includes a membrane according to the first aspect of the present invention, where the membrane is formed of a metal and is permeable to hydrogen.

A fourth aspect of the present invention relates to a sensor that includes a membrane according to the first aspect of the present invention that is formed of a dielectric coating material or a semiconductor material.

A fifth aspect of the present invention relates to an electrospray device that includes a membrane according to the first aspect of the present invention that is formed of a dielectric coating material.

A sixth aspect of the present invention relates to a device for supporting a product during electron microscopy, wherein the device includes a membrane of the present invention that is substantially transparent to light or electron beam.

A seventh aspect of the present invention relates to a method of forming shaped nanoscale products. This method includes the steps of: providing a nanoscale membrane that has a relief pattern formed therein; filling the relief pattern of the membrane with a product; and removing the product from the relief pattern of the nanoscale membrane to obtain shaped nanoscale products.

An eighth aspect of the present invention relates to a method of performing transmission electron microscopy. This method includes the steps of: providing a sample, to be viewed under transmission electron microscopy, upon a membrane of a device according to the sixth aspect of the present invention; and exposing the sample provided upon the membrane to a transmission electron microscope under conditions effective to produce an image of the sample.

A ninth aspect of the present invention relates to a method of producing a nanoscale membrane according to the present invention. This method includes the steps of: applying a nanoscale film to one side of a substrate; masking an opposite side of the substrate; and etching the substrate, beginning from the masked opposite side of the substrate and continuing until a passage is formed through the substrate, thereby exposing the nanoscale film on both sides thereof to form the nanoscale membrane.

The single-side etching procedure described herein uses a different etching chemistry that allows a membrane formed of any material(s) to be locally released from the substrate with a single etching step, forming square edge-bound membranes. This greatly simplifies processing requirements because (i) for $SiO_2$ films, this material is generally more accessible and easier to pattern and remove than SiN; (ii) KOH (a restricted contamination source in most clean rooms) is eliminated; and large area ($500 \times 500$ $\mu m^2$) ultrathin ($<100$ nm) membranes are formed with a single etching step requiring no additional thinning. The modified single-side etching procedure that utilizes sacrificial films to protect the ultrathin nanoscale membrane offers further advantages in being able to prepare membranes having a thickness of less than about 10 nm, and having high aspect ratios. Importantly, the procedures of the present invention avoid the need for mechanical polishing steps or ion beam etching procedures, which can cause damage to planar films in some circumstances and most certainly will cause damage to membranes that bear non-planar relief patterns.

BRIEF DESCRIPTION OF THE DRAWINGS

FIG. 1A schematically illustrates one embodiment of making a nanoscale membrane of the present invention (without sacrificial films). References to silicon, silicon dioxide, and EDP etchant are by way of example only. FIG. 1B schematically illustrates one embodiment of making a nanoscale membrane of the present invention, which differs from the embodiment illustrated in FIG. 1A by the addition of sacrificial oxide films on either side of the film that is to become the nanoscale membrane. References to silicon, silicon dioxide, and EDP etchant are by way of example only.

FIGS. 4A-B are an optical microscopy image of a 550 nm thick $SiO_2$ membrane and the simulated reflectance spectra corresponding to the oxide film on the silicon substrate after release.

FIGS. 5A-D show 50 nm thick, large area sputtered $SiO_2$ membranes. FIG. 5A is a schematic cross-section of a typical 3 mm sample. The membrane remains solidly fixed to the support ring formed from the silicon wafer substrate. FIG. 5B is an interference contrast optical micrograph of the membrane after release, clearly showing wrinkles resulting from the intrinsic compressive strain in the original deposited film. FIG. 5C is an SEM image showing the continuous unbroken membrane. FIG. 5D shows a 3-D surface profile obtained with an optical profilometer. A maximum displacement of 10 µm across the 200×200 µm membrane corresponds to a linear expansion of 0.27%.

FIGS. 6A-D show images of oxide membranes with steadily decreasing thickness. As the oxide membranes become thinner they become less rigid and less reflective.

FIGS. 7A-E depict 7 nm and 3 nm nc-Si membrane formed using sacrificial 20 nm $SiO_2$ films. FIG. 7A is an interference contrast optical micrograph of the released 3-layer membrane (which shows similar structure to a homogeneous oxide membrane). FIG. 7B illustrates that dissolution of the oxide layers in buffered oxide etchant yields a substantially flat nc-Si membrane. FIG. 7C is an interference contrast optical micrograph of the planar nc-Si membrane formed upon dissolution of the oxide layers in buffered oxide etchant. The flatness of this membrane was measured to be <10 nm, and the roughness was <0.5 nm across a similar 200 µm membrane. FIG. 7D is a plan view dark field TEM image of the 7 nm nc-Si film. Only those crystals with the proper crystalline orientation to support electron diffraction appear in this image. FIG. 7E shows a 3 nm thick 400 µm wide membrane.

FIGS. 8A-B are plan view TEM test images of commonly available latex spheres. These test images confirmed the high electron transparency of nc-Si/$SiO_2$ membranes and demonstrated that high resolution images can be taken through this structure. The background texture is nc-Si in the membrane.

FIGS. 11A-B are plan view TEM images of 7 nm thick nc-Si films deposited with the optimized a-Si sputtering conditions.

FIGS. 12A-B show hollow pyramid-shaped shells. FIG. 12A is a 100 nm thick 3-D $SiO_2$ membrane formed by deposition on a nonplanar substrate and released with SSE. FIG. 12B shows that using an oxide membrane similar to that of FIG. 12A as a sacrificial mold, the pyramid array could be fabricated with a 50 nm thick a-Si film. The tips of these pyramids are also quite sharp, with most radii of curvature less than 30 nm.

FIGS. 13A-B are TEM images of nonplanar pyramid shaped $SiO_2$ membranes. There do not appear to be any fundamental limitations associated with imaging or fabricating such highly nonplanar membranes. SSE could therefore be used to provide useful information for future experiments with the current focusing template structure.

DETAILED DESCRIPTION OF THE INVENTION

Figure 1A:
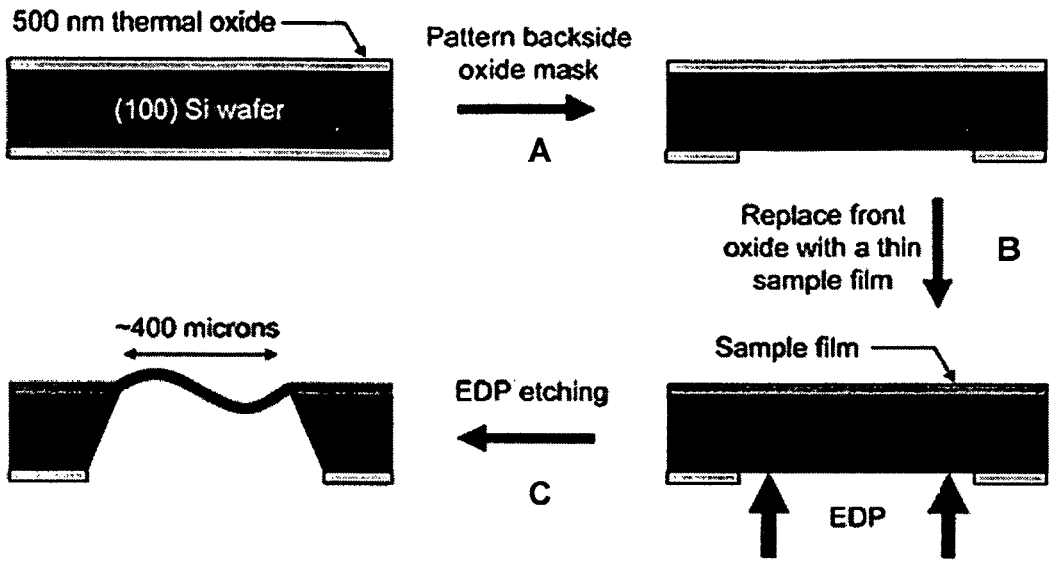
FIGS. 1A-B illustrate two distinct embodiments of the present invention.

The present invention is directed to ultrathin nanoscale membranes, methods of making those membranes, their use as a support for materials during electron microscopy, as well as their use in fuel cells as hydrogen-permeable membranes, in pressure sensors, electrospray devices, and semiconductor devices.

According to one aspect of the present invention, the invention relates to a method of making nanoscale membranes. Any material that is desired to be in the form of a thin film can be prepared as a membrane in accordance with the present invention. By way of example, the material used for fabricating the membrane can be a semiconductor material, a non-conducting material, a metal, an organic polymer, a silica/organic polymer, an optical coating, a dielectric coating, or any combinations of these materials.

As used herein, the combination can include a multilayered stack of one or more of the above-identified materials. One such example of this construction is a bi-layered membrane that includes a first layer of a non-conducting material and a second layer formed of a metal or a semiconductor material.

Semiconductor materials used to prepare the membrane can be any suitable semiconductor material, or combinations thereof, that is capable of being applied as a thin film, whether mixed as alloys or prepared as multilayered structures. Suitable semiconductor materials include, without limitation, undoped silicon or germanium, p-doped silicon or germanium, n-doped silicon or germanium, and a silicon-germanium alloy. Exemplary p-doped silicon or germanium include, without limitation, those containing $(CH_3)_2Zn$, $(C_2H_5)_2Zn$, $(C_2H_5)_2Be$, $(CH_3)_2Cd$, $(C_2H_5)_2Mg$, B, Al, Ga, and In dopants. Exemplary n-doped silicon or germanium include, without limitation, those containing $H_2Se$, $H_2S$, $CH_3Sn$, $(C_2H_5)_3S$, $SiH_4$, $Si_2H_6$, P, As, and Sb dopants. The dopants can be present in any suitable amount. Exemplary alloys of these materials include silicon and germanium alloys in amounts of up to about 10% by weight of germanium, as well as mixtures of these materials, and semiconductor materials based on Group III element nitrides.

Non-conducting materials used to prepare the membrane can be any non-conducting material capable of being applied in the form of a thin film, whether prepared as a single film or a multilayered structure. Exemplary non-conducting materials include, without limitation, oxide glasses, including pure or substantially pure silicon oxide, silicon nitride, non-conducting polymers, and other organic films.

Suitable metals include any metal capable of being deposited in the form of a film, whether applied as a single, substantially pure film, mixed as alloys, or prepared as multilayered structures. Exemplary metals include, without limitation, gold, silver, copper, platinum, aluminum, chromium, titanium, tungsten, lead, tin, and palladium, and palladium alloys.

Suitable organic polymers include any polymer capable of being deposited in the form of a film, whether applied as a single layer film or a multilayered film. Exemplary organic polymers include, without limitation, polyaniline, polyacetylene derivative, polydiacetylene derivative, polyvinylcarbazole derivative, polyparapheneylenevinylene derivative, poly (para-xylylenes), also known as parylenes (such as poly (chloro-p-xylylene) (PPXC), poly(dichloro-p-xylylene (PPXDC) and poly(tetrafluoro-p-xylylene), poly(dimethoxy-p-xylylene), poly(sulfo-p-xylylene), poly(iodo-p-xylylene), poly ($\alpha,\alpha,\alpha',\alpha'$, tetrafluoro-p-xylylene)(AF-4), poly(trifluoro-p-xylylene), poly(difluoro-p-xylylene) and poly (fluoro-p-xylylene)), polyimides such as poly(N-phenylmaleimide), can also be used.

Furthermore, covalent oxide-organic polymer phases can be manufactured using precursors including, without limitation, vinyl triethoxysilane/parylene, vinyl triacetoxysilane/ parylene, and vinyl tri-t-butoxysilane. Any poly(para-xylylene) can be used for any of the above oxide-organic polymer copolymers.

Suitable optical coatings include any optical coating capable of being deposited in the form of a film, whether applied as a single layered film or a multilayered film. Exemplary optical coatings include, without limitation, titanium dioxide, magnesium fluoride, and other metal oxides.

Suitable dielectric coatings include any dielectric coating capable of being deposited in the form of a film, whether applied as a single layered film or a multilayered film. Exemplary dielectric coatings include, without limitation, inorganic dielectrics such as $HfO_2$, $TiO_2$, $MgF_2$, $Y_2O_3$, $La_2O_3$, $Ta_2O_3$, $ZrO_2$, etc.

The method of preparing the membrane generally involves the steps of applying a nanoscale film to one side of a substrate, where the nanoscale film is formed of a material as described above and also masking an opposite side of the substrate. These steps can be performed in either order. After masking and applying the nanoscale film, the substrate is etched, beginning from the masked opposite side of the substrate and continuing until a passage is formed through the substrate, thereby exposing the film on both sides thereof to form a membrane.

These steps are described in greater detail in association with the schematic illustration of FIG. 1A. (Although FIG. 1A refers to silicon, silicon dioxide, and EDP etchant, it should be appreciated that such references are by way of example only.)

The substrate to be used to support the nanoscale membranes is preferably a substrate that can be easily masked and etched so that a membrane can be formed. Silicon is a preferred example of one such substrate. Using standard 4, 6, 8, or 12 inch silicon wafers as the support, upwards of about 1500, 500 μm×500 μm, of the nanoscale membranes can be formed on its surface depending on the desired linear area to be occupied by the membrane. Using silicon as the example, silicon contains a naturally occurring thermal oxide layer. To simplify the procedures used in preparing and forming the films of the present invention, this thermal oxide layer is preferably removed entirely from one side of the substrate and partially removed (i.e., during the masking procedure) from the opposite side of the substrate, in both instances using a buffered oxide etchant ("BOE") such as, but not limited to, "buffer HF improved" etchant (Transene Company Inc., Danvers, Mass.). This is illustrated in Steps A and B, respectively, of FIG. 1A-B.

Figure 2:
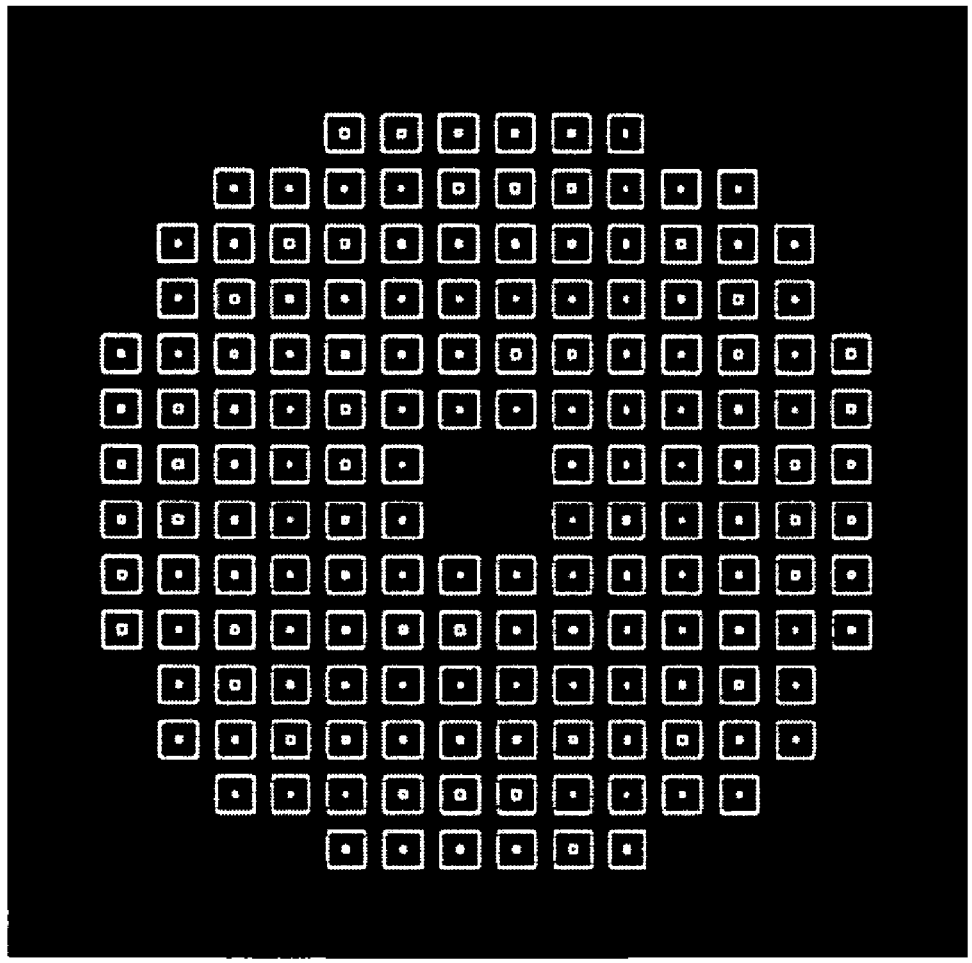
FIG. 2 illustrates the backside masking of elements so as to facilitate formation of an etched passage through the substrate (i.e., to expose the membrane) as well as a trench in the substrate to allow for removal of an individual membrane.

The masking step is preferably performed by forming an array of elements that will dictate the manner in which the unprotected substrate will be etched. According to one embodiment, illustrated in FIG. 2, each element is composed of a square hole surrounded by a square outline. This allowed the formation of membrane structures, and also cut a trench around each membrane so that samples could be individually removed from the wafer. Other configurations can, of course, be utilized without departing from the scope of the invention. When the feature sizes on the mask are fairly large, they can be printed directly on film using a high quality laser printer. A film of this sort can be mounted on a glass mask blank and used as a standard photolithography mask. The backside $SiO_2$ can be patterned with standard photolithography, followed by an 10 min soak in 4:1 BOE to transfer the pattern into the oxide layer. The photoresist can be removed with acetone.

To the side of the substrate that lacks the oxide layer, a film of the material or materials that are to be used to form the membrane is subsequently applied to the substrate. This is illustrated in Step B of FIG. 1A. In a preferred embodiment, the nanoscale film is preferably applied between applications of sacrificial oxide films (i.e., one sacrificial film applied to the substrate, and the other sacrificial film applied to the nanoscale film, thereby sandwiching the nanoscale film). This preferred approach is illustrated in Step B of FIG. 1B.

The sacrificial oxide films can be applied to form any desired relief pattern in the nanoscale film, or the oxide and nanoscale films can be applied in a manner that achieves substantially planar films that have little variation in thickness or surface roughness (i.e., the films are locally smooth). Relief patterns can be formed by, e.g., etching the front face of the substrate prior to application of the sacrificial film.

Preferably, the oxide film is one that is etched at a rate that is at least an order of magnitude, more preferably two orders of magnitude less than the rate at which the substrate is etched by a particular etchant. This allows for precise control of the etching process; essentially, the etching process comes to a halt once the sacrificial oxide layer is encountered. This is illustrated in Step C of FIGS. 1A-B.

Any oxide film that resists etching (under conditions that are used to etch the substrate) can be used as the sacrificial film. Exemplary oxide films include, without limitation, silicon dioxide, titanium dioxide, tin oxide, aluminum oxide, zinc oxide, hafnium oxide, and tantalum oxide. Based on testing of oxide membranes alone, it was expected that a 10 nm film of sputtered oxide would be sufficient to protect the sandwiched layers from the etchant, although such membranes cannot mechanically support themselves alone. To build in additional tolerance, however, 20 nm sacrificial oxide films became standard for all nc-Si membrane fabrication and transmission electron microscopy imaging experiments as described in Examples 2-3.

Application of the oxide films and sandwiched nanoscale films can be carried out using any approach that allows for control of the film thickness. Exemplary approaches include, without limitation, radio-frequency ("RF") magnetron sputtering, low pressure chemical vapor deposition ("CVD"), plasma enhanced CVD, thermal chemical growth, RF sputtering, DC sputtering, thermal evaporation, electron beam evaporation, and electroplating. Of these, RF magnetron sputtering and electron beam evaporation are preferred. The conditions employed during the film application steps can be selected according to the desired film composition and thickness, as is known by those of skill in the art. The conditions employed during the application can also be altered during the course of the application step, thereby achieving strata within the films that have varying properties. Exemplary condition changes include, without limitation, pressure changes, plasma density changes, plasma power changes, temperature changes, gas composition changes, and source material changes (i.e., to form multilayered or composite membranes).

With regard to the application of silicon dioxide and amorphous silicon films, the use of a high quality variable angle spectroscopic ellipsometer (VASE) and a full wafer compatible atomic force microscope (AFM) allowed for reproducible and stable characterization of the films to be performed. This allowed for optimization of the conditions utilized with RF sputtering procedures that were employed in the Examples described herein. Basically, $SiO_2$ films were reliably prepared at 750 W RF power, 15 mTorr chamber pressure, 6.0 sccm argon flow, and 7.6 sccm oxygen flow, where the films exhibit very low rms roughness (at most about 0.27 nm) and film thickness is dictated by the deposition time. Amorphous silicon films were prepared at 150 W RF power, 150 mTorr chamber pressure, and 300.0 sccm argon flow. As with the oxide films, the deposited thickness of a-Si was found to be a linear function of time. The use of other oxide films, other semiconductor films, and films formed of other material, as described above, can be optimized for the particular equipment that is employed.

Films that lack an intentional relief pattern are described herein as being substantially smooth or locally smooth. These terms are both used to refer to the planar nature of the film surface(s), which is indicated by a surface roughness of less than about 1 nm, preferably less than about 0.5 nm, most preferably less than about 0.4 nm, 0.3 nm, or 0.2 nm.

The membranes of the present invention can be prepared in any desired submicron thickness, but preferably less than 100 nm. In some embodiments, the membranes can be less than about 90 nm, about 80 nm, about 70 nm, or about 60 nm, or even less than about 50 nm, about 40 nm, about 30 nm, or about 20 nm. In some embodiments, membranes of between about 2 to about 25 nm are preferred. Particularly preferred are membranes that are less than about 10 nm thick, including those than are between about 1 nm to about 9 nm, about 2 nm to about 8 nm, about 2 nm to about 5 nm, and about 6 nm and about 10 nm thick.

Figure 1B:
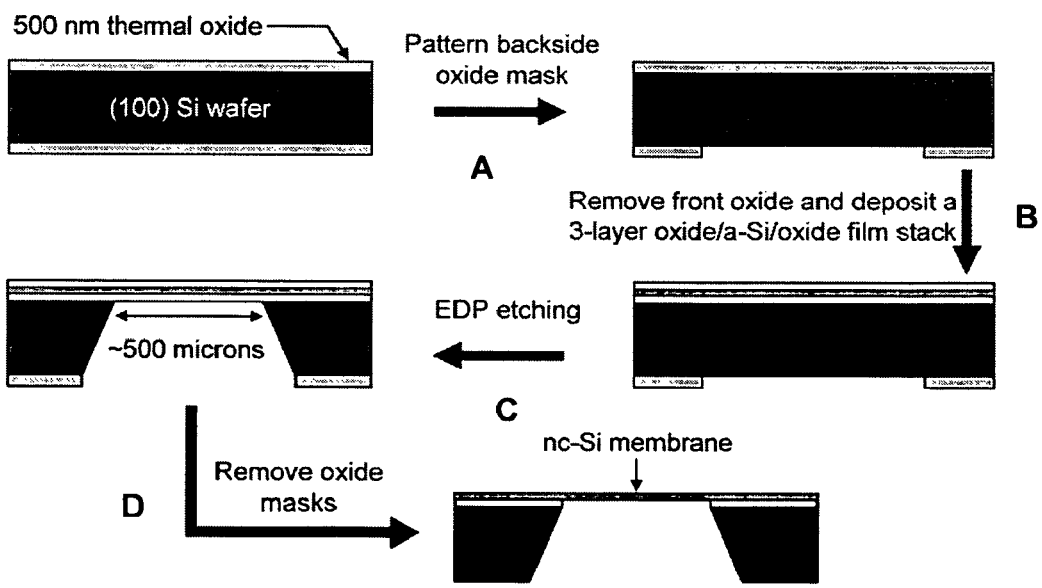

Optionally, those films that can be annealed to induce crystallization, such as semiconductor films, can undergo any form of annealing prior to or after Step C of FIG. 1B. Annealing can be performed after etching in some circumstances, particularly where the etch process removes only a limited amount of the total mass of the substrate. In other words, where the integrity of the etched substrate will not be altered during annealing, annealing of the film (the released multi-layered film) can be carried out after etching. Otherwise, the annealing is preferably performed on the film prior to etching so as to minimize strain applied to the membrane.

The annealing process, if performed, can be carried out using known procedures for annealing semiconductor materials. Basically, these annealing processes afford sufficient heating of the semiconductor and sufficient dwell time (i.e., temperature and duration) so as to foster crystal growth. Preferably the annealing is performed in a manner that achieves substantially uniform crystal growth, where the average crystal sizes are in the nanometer range, more preferably less than about 100 nm, about 90 nm, or about 80 nm in size, even more preferably less than about 70 nm or about 60 nm or about 50 nm in size, most preferably less than about 40 nm, about 30 nm, about 20 nm, about 10 nm, or even as low as about 2 nm in size.

Suitable annealing processes include, without limitation, furnace annealing, rapid thermal annealing ("RTA"), laser annealing, and combinations thereof. Excellent results have been obtained with RTA alone or in combination with furnace annealing. With respect to the conversion of amorphous undoped silicon to form a crystalline (i.e., polynanocrystalline) silicon, preferred temperature ranges are between about 650° C. and about 900° C., more preferably about 715° C. and about 800° C.; and preferred annealing durations are between about 20 seconds and about 2 minutes for RTA, or between about 15 minutes and about 2 hours for furnace annealing. Conditions for doped silicon and silicon alloys will vary slightly. Conditions for pure and doped germanium will have anneal temperatures in the range of about 450° C. to about 900° C., more preferably about 500° C. to about 700° C.; anneal times will be about the same as those described for silicon. The annealing temperature and duration is also limited by the selection of the substrate upon which the films are formed; the temperature and duration should be selected to avoid deformation of the substrate.

Any suitable etching solution that, as noted above, selectively etches the substrate over the sacrificial oxide films can be employed. While one, two, or three orders of magnitude difference in selectivity is suitable, a preferred etchant has approximately four orders of magnitude ($10^4$) difference in selectivity between silicon/silicon dioxide. This preferred etchant, known as EDP, contains ethylenediamine, pyrocatechol, pyrazine, and water. This etchant has an $SiO_2$ etch rate of only 0.2 nm/min, with a corresponding (100) silicon etch rate of about 1400 nm/min. Other advantages of EDP is that it contains no metal ions (such as sodium or potassium) that create serious contamination issues in cleanroom facilities, and this etchant solution is also known to produce fewer hydrogen bubbles during etching, leading to a smoother etch front.

One preferred form of the EDP solution is commercially available from Transene Company, Inc. (Danvers, Mass.) under the label PSE300F (i.e., "Preferential Silicon Etch 300—Fast"). This solution contains 1 L ethylenediamine, 320 g pyrocatechol, 320 mL water, and 6 g pyrazine.

Because EDP requires about 6 hours to etch through the substrate, and EDP would otherwise have consumed the thin sputtered films on the front surface if exposed to EDP for the full 6 hours, an etch cell was created that allows for submersion of the backside (i.e., masked side) of the substrate while allowing the film-deposited side of the wafer to remain unexposed to the etchant. This therefore avoids the need for thick oxide masks, which would have been required for submersion of the entire wafer in the etch cell.

Figure 3:
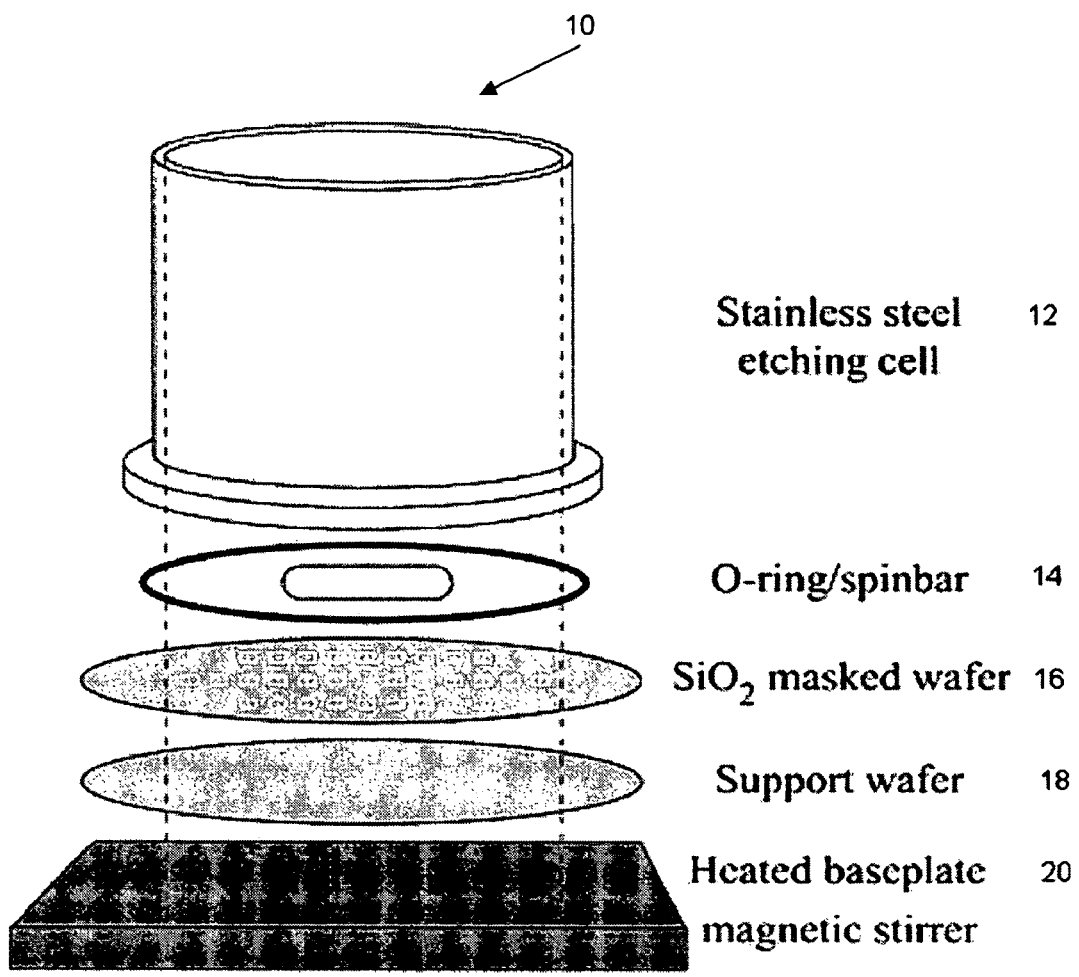
FIG. 3 illustrates a single surface etching cell used to ensure that etchant is only exposed to the backside of the wafer. The solution is heated indirectly through the baseplate (shown) or the sidewall of the cell, and the temperature is controlled using feedback from a thermocouple submerged in the solution (i.e., inside the etching cell).

As noted above, the etching process is carried out beginning from the backside (i.e., masked side) of the substrate. This process is illustrated in Step C of FIG. 1A and Step D of FIG. 1B. This process is preferably carried out in an etch cell 10 of the type illustrated in FIG. 3. Basically, a stainless steel cylinder collar 12 is sealed over the backside of the masked substrate (i.e., masked Si wafer 16) using a nitrile O-ring 14 mounted in a groove at the base of the cylinder. The O-ring allows a tight seal to be formed against the wafer to be etched. A support wafer 18 provides a planar support surface to the membranes when they are released from the substrate (i.e., when etching of the substrate is completed). The etching solution can be heated through the baseplate 20 or through cell 10 with, e.g., an electrical resistance heater, and a stable solution temperature can be maintained with feedback from a thermocouple. Magnetic stirring can also applied through the baseplate, ensuring adequate mixing of the etchant. A condenser (not shown) mounted to the top of the cell can be used to prevent excessive evaporation during the ~6 hour etches. Using an etch cell of this time requires only ~250 mL of EDP for a standard 4 inch silicon wafer. This allows fresh solution to be used for every etch, promoting reproducibility.

Although there are several ways to design a tool that etches only a single surface of a semiconductor wafer, the above-described design has the advantage of making very efficient use of the etching solution. The 250 mL used for each etch is near its silicon saturation limit and can be discarded after each use. Other techniques may involve protecting one side of the wafer and submerging it in a much larger volume EDP bath. A larger volume is not usually disposed of after each etch, due to expense, and therefore each successive etch will see a solution with different properties.

Following etching, in the absence of using sacrificial films, the membrane is formed (FIG. 1A at Step C). When sacrificial films are employed, a final step is employed to remove these films (FIG. 1B at Step D). The sacrificial films are removed from both sides of the underlying membrane using an etchant that selectively etches oxide films over the material used to form the membrane. Suitable etchants include, without limitation, buffered oxide etchant solutions and hydrofluoric acid etchant solutions. Exemplary buffered oxide etchant solutions include, without limitation, about 6 to about 25 wt % (more preferably about 6 to about 10 wt %) HF (BOE contains HF and ammonium fluoride—concentrations vary by manufacturer). Exemplary hydrofluoric acid solutions include about 5 to about 25 wt % HF, more preferably about 5-15 wt % HF.

Conditions employed for removal of the sacrificial oxide films include dipping the etched substrate in an appropriate etchant solution for sufficient amount of time to cause the oxide films to be substantially removed from the underlying nanoscale film. Typical times for a 20 nm oxide film, at an oxide etchant temperature of about 22° C., include between about 10 sec and about 8 minutes.

Upon removal of the sacrificial oxide films, the resulting nanoscale membrane is exposed on its opposite sides. Individual membranes can be removed from the larger wafer given the masking pattern utilized (described above). Alternatively, a whole wafer can be maintained with a plurality of the membranes formed thereon.

The nanoscale membranes have thicknesses within the ranges described above. The membranes are also characterized by a large surface area not previously obtained for semiconductor membranes. In particular, surface areas up to about 10 mm$^2$ have been obtained. In addition, membranes having lateral length to thickness aspect ratios greater than 10,000:1 have been obtained. In certain embodiments, aspect ratios greater than 50,000:1, 100,000:1, and 430,000:1 have been obtained. Given the stability of the films and the manufacturing procedures, it is expected that aspect ratios of up to 1,000,000:1 can be achieved.

Another aspect of the present invention relates to a structure that includes a support having at least one passage extending between opposite surfaces of the support and at least one nanoscale membrane, as described according to the present invention, which is exposed on opposite sides. The membrane can have an average thickness of less than 100 nm and at its outer edges be bound to or supported by the support. The membrane also confronts a passage and can be formed of silicon or other suitable substrates.

Ultrathin membranes of the present invention can be formed with a relief pattern, i.e., while they are not substantially planar they may be substantially smooth (having a low roughness). Such membranes can be used to form shaped nanoscale products. This involves preparing nanoscale membranes, as described according to the present invention, whereby the membrane possesses a relief pattern therein, filling the relief pattern on the membrane with a product, and removing the product from the relief pattern of the nanoscale membrane to obtain shaped nanoscale products. The product can be treated, i.e., heat treated, prior to its removal from the relief pattern.

Ultrathin membranes that possess a relief pattern, for example of the type disclosed in Example 4, can also be used as a field emission source of electrons or as arrayed scanning probes. With regard to ultrasharp pointed objects like those illustrated in FIGS. 12A-B and 13A-B, the devices can be employed as field emission sources of electrons for plasma TV's or the like. In addition, probes tips can be fabricated with a 2D array of the ultrasharp pointed membranes; such probe tips can be used, for example, during multiplexing scanning probe microscopy (SPM) techniques. By "dragging" the ultrasharp points across an objected to be measured and monitoring deflection, the object can be characterized. These techniques include atomic force microscopy (AFM), scanning tunneling microscopy (STM), and various near-field scanning optical microscopy (NSOM) techniques. The array of ultrasharp tips can be formed with precise control of distance, shape, and height based upon the etching relief pattern used to modify the front side of the wafer prior to film deposition. In addition, depending upon the nature of the film layer deposited between the sacrificial oxide films, these tips can be flexible membranes, allowing them to conform to the surface being measured, or to compensate for external vibration or alignment issues.

Another aspect of the present invention relates to a method of performing transmission electron microscopy. This method employs a nanoscale membrane of the present invention that is substantially transparent to light or electron beam. By "substantially transparent" to these forms of energy, it is intended that, in the aggregate, about 90 percent, more preferably greater than about 95 percent, most preferably greater than about 99 percent of the light or electron beam can pass through the membrane. The method involves providing a sample which is to be viewed under transmission electron microscopy upon a nanoscale membrane of the present invention, and exposing the sample provided upon the membrane to a transmission electron microscope under conditions effective to produce an image of the sample. In some embodiments, the sample can be placed onto the membrane after formation thereof or prior to formation of the membrane. The sample is preferably protected against action of the etchant.

The present invention further relates to an electron microscope sample support device that includes a membrane of the present invention that is substantially transparent to light or electron beam.

Although transmission electron microscopy can be carried out on materials placed onto the membranes, TEM can also be performed on devices that can be fabricated on a silicon wafer that contains the membrane. Devices, therefore, can be examined by TEM without displacing them after fabrication.

Metal nanoscale membranes of the present invention, preferably those formed of platinum, palladium, or a palladium alloy, can be used in fuel cells of the type described, e.g., in U.S. Pat. Nos. 6,319,306 and 6,221,117 to Edlund et al., both of which are incorporated by reference in their entirety. These ultrathin metal membranes are porous to hydrogen.

Dielectric membranes of the present invention find a number of uses, including, without limitation, as a component of a pressure sensor (see U.S. Patent Application Publ. No. 20050262947 to Dehe, which is hereby incorporated by reference in its entirety), or a piezoelectric or piezoresistive sensor (see U.S. Patent Application Publ. No. 20050193827 to Fischer et al., which is hereby incorporated by reference in its entirety), or at the surface of an electrospray device (i.e., when energized) (see U.S. Patent Application Publ. No. 20050258360 to Whitehouse, which is hereby incorporated by reference in its entirety).

The ultrathin membranes of the present invention are highly sensitive detectors of pressure changes. Ultrathin membranes are the most sensitive class of pressure sensors because very little pressure is required to induce a measurable deflection of these membranes. Because silicon has a high refractive index and therefore can reflect light well, optical techniques can easily measure nanoscale deflections of the membrane (see, e.g., Jiang et al., "Freely Suspended Nanocomposite Membranes as Highly Sensitive Sensors," *Nature Materials* 3:721-728 (2004), which is hereby incorporated by reference in its entirety). One application of an ultrathin sensor membrane of this type is to measure very weak sounds (i.e., a microphone), whereby sound waves transmitted to the membrane will cause a measurable deflection of the membrane.

In addition, the membranes can be used for total isolation of devices for operation and characterization. By "isolation", it is intended that a device mounted on a membrane of the present invention can be isolated from thermal, electrical, radio-frequency, optical, x-ray, and/or mechanical (vibration) energy. Because the membrane is ultrathin, placing a device on such an ultrathin membrane is as close to suspending it in mid-air as possible. Devices suspended on a membrane of this type can be important for sensitive devices and sensors (which need to be insulated against various forms of energy described above), as well as for various material characterization techniques (i.e., exposing devices to various forms of energy including light, electron beams, x-rays, electric fields, and force).

EXAMPLES

The following examples are provided to illustrate embodiments of the present invention but are by no means intended to limit its scope.

Example 1

Formation of Silicon Dioxide Membranes

After having identified EDP as an anisotropic etchant capable of etching through the bulk of a silicon wafer and stopping abruptly on a thin oxide film, a process had to be engineered for this chemistry. An outline of such a procedure is shown in FIG. 1. This figure illustrates a through-wafer backside etching process graphically. Because $SiO_2$ is so resistant to EDP, a 500 nm thermal oxide is adequate to mask the backside of the wafer (approx 500 microns thick) during the entire duration of the etch. This is quite advantageous since oxide is far easier to deposit, pattern, and remove than SiN, the standard masking layer for through wafer etches with KOH. As indicated in FIG. 1, after the growth of the mask oxide, the backside is patterned. During this patterning process, the front oxide protects the surface from damage induced by handling. The frontside oxide is then removed, and the sample layer of interest is deposited on the front surface. Using an etching cell of FIG. 3, the backside of the wafer can then be exposed to EDP to remove the unprotected silicon, while the film applied to the front side of the wafer remains substantially unadulterated by the EDP etch. Upon completion of etching through the substrate, a membrane is released.

The single-side etching procedure was optimized with a series of test etches on wafers that still had the frontside 500 nm thermal oxide. These experiments allowed the mask feature sizes to be adjusted, while a reproducible process flow was practiced. Most of these membranes remained intact and a typical membrane sample, with a measured thickness of 550 nm, is shown in FIG. 4A. FIG. 4A shows a plan view optical micrograph of a light red colored membrane that is fully intact and attached to the surrounding silicon substrate. This is a clear example of how thin film interference effects change when the high index silicon substrate is removed from beneath a thin oxide film. Since the silicon substrate has a higher refractive index than the oxide, there is a phase shift of $\pi$ when light is reflected from the substrate interface. When this light interferes with light reflected from the top surface of the film, the result is the yellow-green color of the substrate in the image and the corresponding simulated reflectance spectrum. However, when the substrate is removed, the bottom surface of the oxide is bounded by air, with a lower refractive index. There is no longer a phase shift and the spectrum "inverts", as demonstrated by the red color of the membrane and the corresponding simulated spectrum (see FIG. 4B).

Another feature visible in this image is the wrinkled appearance of the membrane. This is a direct and expected result due to the intrinsic compressive stress in thermally grown oxide (Hu, *J. Appl. Phys.* 70:R53-R70 (1991), which is hereby incorporated by reference in its entirety). When the substrate is removed, the compressed film is free to expand and wrinkle.

The next set of fabrications focused on thinner sputtered oxides to study their stability and to explore the thickness limit of the membrane release process. FIGS. 5A-D illustrate several images of a sputtered 50 nm thick $SiO_2$ membrane. FIG. 5A is a cross sectional schematic drawing of a sample after removal from the substrate. Film thicknesses for all the ultrathin membrane experiments were accurately determined prior to SSE with spectroscopic ellipsometry. After substrate removal, these oxide films also buckle due to the intrinsic compressive stress from sputter deposition, but they remain unbroken and rigidly attached to the substrate around the entire perimeter (see FIGS. 5B-C). Although some membranes rupture during release and rinsing, typically 90% of the 50 nm oxide samples are unbroken. FIG. 5D is a 3D surface profile, indicating a maximum displacement of 10 microns across a 200×200 $\mu m^2$ membrane. By integrating along a cross-section in the middle of this membrane, it was determined that this buckling results from a 0.27% linear expansion of the film after release from the substrate. This expansion is directly related to the intrinsic compressive strain in the original film and is about half the value reported for thermal oxide, as expected for a sputtered film. A similar measurement performed on the surface profile of a 550 nm thermal oxide membrane obtained a linear expansion of 0.39%, in general agreement with these conclusions.

Several thinner oxide films were also released and images of these membranes are shown in FIGS. 6A-D, in addition to two thicker membranes for comparison. Oxide membranes as thin as 10 nm were fabricated, but these structures became increasingly delicate and fewer than 10 percent of the membranes below 20 nm thickness typically survive. One issue related to the characterization of these films is they become almost completely transparent in the <20 nm regime, making them difficult to identify. This is evident in the FIG. 6C, where the 20 nm film is very difficult to see even with the image contrast increased to make it more visible. The 10 nm film is completely invisible to an optical microscope, and therefore an SEM image is presented in FIG. 6D. This suppression of optical reflectance is expected from thin film interference arguments. As the optical path length approaches zero, interference is determined almost entirely by the interface phase shifts. For an oxide film with air on both sides, there is a net phase shift, leading to destructive interference. It is worth noting that this 10 nm film is also invisible to the SEM with the normal 5 keV to 10 keV accelerating voltage, and this voltage had to be reduced to 0.8 keV to acquire the image. The SEM image also shows spontaneous folding of the membrane that tends to draw in some of the excess surface. This indicates that membranes of this thickness have lost the small amount of rigidity required to support themselves and are obviously in a much weakened state. A support device, such as a screen or the like, would be required for use of such a weakened membrane.

Example 2

Formation of Nanocirystailine Silicon Membranes

Nc-Si membranes were fabricated by the procedure outlined in FIG. 1B. A 500 nm thick layer of $SiO_2$ on both sides of a silicon wafer was first grown by placing it in a semiconductor tube furnace at 1000° C. for 2 hours in an ambient of oxygen and steam. On the backside of the wafer, the $SiO_2$ is patterned using standard photolithography techniques to form an etch mask for the membrane formation process. The etch mask for each membrane included a square-shaped opening centrally positioned within a square border (up to 120 masks have been formed on a single silicon wafer). The front oxide layer was then removed by exposing the surface to 4:1 buffered oxide etchant, for 10 minutes in an etching cell similar to that used for EDP etching, and a high quality three layer film stack (20 nm-$SiO_2$/15 nm-amorphous silicon/20 nm-$SiO_2$) was RF magnetron sputter deposited on the front surface. The a-Si layer was sputtered at a chamber pressure of 150 mTorr in Ar with a target power density of 0.4 W/cm², yielding a deposition rate of 3.4 nm/min. The $SiO_2$ layers were reactively sputtered from a silicon target at a chamber pressure of 15 mTorr, with a (3:4) Ar:$O_2$ gas flow ratio, and a target power density of 1.8 W/cm², yielding a deposition rate of 10.7 nm/min. The deposition recipe is well characterized and capable of depositing films with ±1% thickness accuracy and surface roughness <0.5 nm.

Crystallization of very thin amorphous silicon films, forming high quality nanocrystals with well-defined size has been previously demonstrated (Grom et al., "Ordering and Self-Organization In Nanocrystalline Silicon," *Nature* 407:358-361 (2000), which is hereby incorporated by reference in its entirety). To form the nc-Si membranes, the substrate was briefly exposed to high temperature (715° C.-770° C. for 30 sec) in a rapid thermal processing chamber, crystallizing the amorphous silicon into a nanocrystalline film. The patterned wafer backside was then exposed to the highly selective silicon etchant EDP (Reisman et al., "The Controlled Etching of Silicon In Catalyzed Ethylenediamine-Pyrocatechol-Water Solutions," *J. Electrochem. Soc.* 126:1406-1415 (1979), which is hereby incorporated by reference in its entirety), which removes the silicon wafer along (111) crystal planes until it reaches the bottom silicon dioxide layer of the front side film stack.

The etching procedure began by exposing the masked backside of the patterned wafer to a 50:1 (hydrofluoric acid: water) solution for 2 minutes to remove any native oxide in the unprotected areas. 250 mL of EDP was then heated to 80° C. in a pyrex beaker while the wafer was mounted in the etching cell. This preheating was performed to prevent the temperature from overshooting the set value during the ramp up to the temperature set point. The preheated EDP was then poured into the etch cell (see FIG. 3) and the solution was heated to 105° C. with stirring. After the temperature stabilized at 105° C., the system remained in a constant equilibrium state for the duration of the etch. Under these conditions, an etch rate of approximately 1.4 μm/minute was obtained, completing a 500 μm etch in about 6 hours.

After etching was complete, the EDP was removed from the cell and the wafers were carefully rinsed in deionized water. Exposing the three layer membrane to 15:1 buffered oxide etchant (BOE) for 60 sec at 22 C. removed the protective oxide layers leaving only the freely suspended ultrathin nc-Si membrane. A final rinse in ethanol or pentane was typically used to reduce the surface tension while drying the membranes.

This process has been used to fabricate square membranes as thin as 3 nm and as thick as 500 nm; and square membranes as small as 10 μm×10 μm and as large as 3 mm×3 mm. This etch has also been used to outline approximately 120 samples (3.5 mm×3.5 mm) that can be easily removed from the wafer after the fabrication process is complete, and used individually, e.g., for electron microscopy.

Example 3

Formation of Additional Nanocrystalline Silicon Membrane

The procedure described in Example 2 was used to form a 7 nm a-Si layer sandwiched between two 20 nm layers of $SiO_2$ using sputter deposition (see FIG. 7B); the silicon was then annealed at 950° C. for 30 sec to form a nc-Si layer. After release, a wrinkled membrane similar to other oxide membranes was formed (FIG. 7A). However, after the removal of the sacrificial $SiO_2$, with a 25 second dip in buffered oxide etch (BOE), an extremely flat 7 nm ne-Si membrane was produced (see FIGS. 7B-C). This dramatic shift from compressive to tensile stress was unexpected, yet is indicative of the volume contraction that occurs when a-Si is crystallized (Miura et al., *Appl. Phys. Lett.* 60:2746 (1992), Zacharias et al., *Journal of Non-Crystalline Solids* 227-230:1132 (1998), which are hereby incorporated by reference in their entirety). Since the oxide remains compressively stressed after annealing and is much thicker than the a-Si, the overall film stress is compressive in the initial wrinkled film. However, after the oxide is removed, the nc-Si layer is free to return to a tensile state. This two step membrane release process is also very robust with a yield greater than 80% in initial 7 nm process tests. FIG. 7D is a dark field TEM image of a 7 nm nc-Si film showing crystals with dimensions similar to the film thickness, confirming previous reports (Tsybeskov et al., *Mat. Sci. Eng.* B 69:303 (2000), which is hereby incorporated by reference in its entirety). To test the physical limits of this process, the 3 nm silicon membrane in FIG. 7E was fabricated with a width:thickness aspect ratio exceeding 100,000:1. It is believed that this is the thinnest, high aspect ratio membrane ever reported and it clearly demonstrates the capabilities of the SSE process. It is possible that even thinner membranes can be formed; no limit has yet been achieved.

To test the electron transparency of these membrane structures, 90 nm latex spheres were deposited on a few of the three layer sandwich samples with a 7 nm oxide. As seen in FIGS. 8A-B, the membranes were very transparent, the latex was easily imaged, and fine structure is clearly observable. Upon careful inspection, some silicon nanocrystals are observable in the background texture.

Figure 9A:
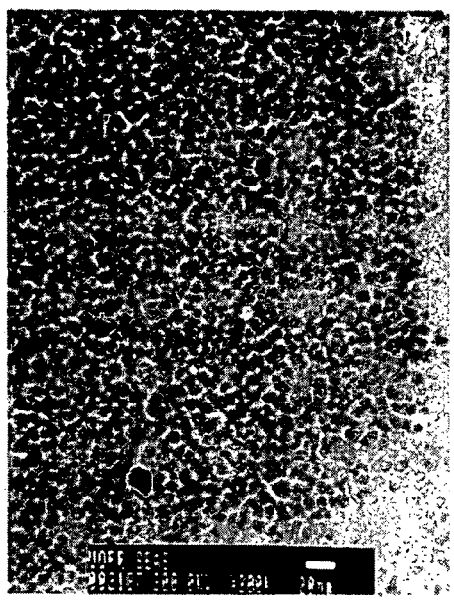
FIGS. 9A-B depict a comparison of bright field and dark field images of a 20 nm thick nc-Si film after RTA only. The bright field image contrast is due primarily to density differences, while the dark field patterns are formed by electron diffraction from crystalline material.
Figure 9B:
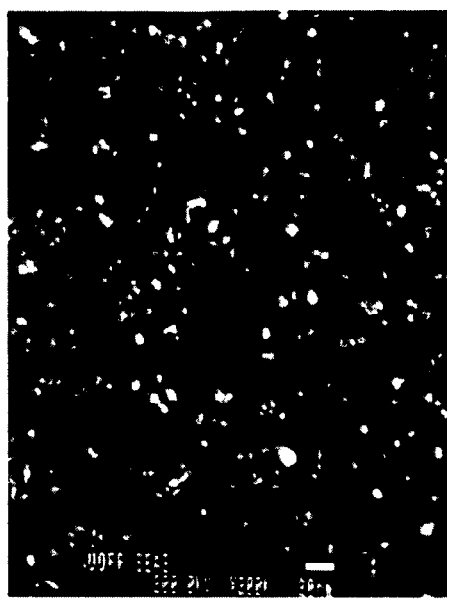

In FIGS. 9A-B, a comparison of bright field and dark field TEM images is made for a 20 nm nc-Si layer that only received an RTA at approximately 750° C. for 60 sec. The bright field mode is directly analogous to an optical microscope operating in transmission. Contrast is obtained primarily through density variations in the sample. In this particular image the grain structure is clearly visible but the degree of crystallization cannot be readily determined. A dark field image is formed only by electrons that have diffracted from crystalline material. Therefore any bright spots in the image are nanocrystals. However, not all crystals are at the proper orientation to support diffraction, and therefore the observed nanocrystals are assumed to be a small fraction of the total.

Figure 10A:
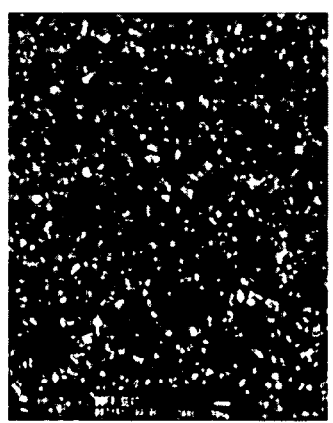
FIGS. 10A-C are TEM dark field images of nc-Si films with different thicknesses. No clear nanocrystal size dependency is observed relative to thickness, but the density of nanocrystals appears to increase for thicker films.
Figure 10B:
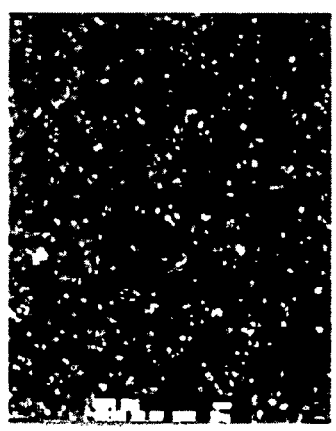
Figure 10C:
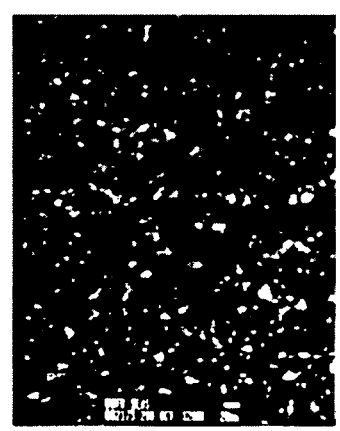

A comparison of films with substantially different thickness was performed to determine the effect of a-Si layer thickness in the lateral size of the nanocrystals. For thin layers the nanocrystals were expected to be spherical and for thicker films, considerably larger brick shapes have typically been observed. The images in FIGS. 10A-C do not agree with these previous observations and surprisingly seem to indicate that no clear size dependence exists for films in this thickness range, although the nanocrystal aerial density does appear to increase with increasing thickness. All images were taken at the same magnification and are directly comparable. It is unclear why the current nc-Si material does not crystallize in the same manner as has been observed in the past. This result is surprising, and illustrates the potential importance of plan view TEM studies in characterizing film structure in this material system.

Images of two 7 nm thick nc-Si layers deposited high refractive index a-Si sputtering conditions are displayed in FIGS. 11A-B. One film was treated with an approximately 750° C./60 sec RTA only (11A), and the other had the same RTA in combination with a 1050° C./10 min furnace anneal (11B). All anneals were performed in a nitrogen environment. Both images are dark field and were taken at the same magnification. As with the previous TEM images, a substantial number of bright nanocrystals are observable, however there are also black spots in both images that had not been observed in other samples. These spots are actually holes in the film. In dark field, only properly aligned crystals appear bright, but amorphous and misaligned crystalline material will also scatter the electron beam and produce a very weak background illumination. The dark spots in the images are the absence of this background, indicating that no material is present. This interpretation also agrees with similar bright field images. It is also apparent from these images that the longer furnace anneal promotes the formation of these features because the hole density is much higher in the left image and are either due to voids in the film itself or they are regions of oxide formed during the annealing process that are removed when the barrier oxides are etched away.

Example 4

Formation of Silicon Dioxide Membrane having a Relief Pattern

The single-side etch procedure, as described, was also used to prepare a non-planar membrane of the type illustrated in FIGS. 12A-B. FIG. 12A is an SEM image showing a periodic array of 6 micron pyramids that appear solid, but are actually just corrugations in a 100 nm sputtered oxide. This film is a replica of an array of pyramid shaped holes formed on the front surface of a silicon wafer using interference lithography and anisotropic etching (Striemer et al., *Nano Lett.* 1:643 (2001), which is hereby incorporated by reference in its entirety). After an oxide was sputtered onto this nonplanar surface, the substrate was removed with the same etching process applied to the planar films (described in the preceding examples), leaving the pyramid array shown in FIG. 12B. Such 3D $SiO_2$ membranes can be used as sacrificial molds for the shaping of other materials. For example, when a membrane similar to FIG. 12A was used as a substrate for sputtering a 50 nm a-Si film and subsequently removed with BOE, the a-Si membrane in FIG. 12B was formed. A uniform array of sharp tips (<30 nm radius) in an amorphous material is difficult to fabricate with standard processes, but was greatly simplified with the sacrificial membrane mold. This technique can be applied to a wide range of nanoscale material shaping and 3D patterning applications, and is sufficiently robust to be adaptable to various material systems and deposition methods.

To demonstrate the potential for imaging such nonplanar films, the TEM images in FIGS. 13A-B were taken. These films were considerably thicker than the single nc-Si membranes discussed in Examples 2-3, but there appear to be no inherent limitations that would prevent the imaging of the tip of a pyramid structure.

Although the invention has been described in detail for purposes of illustration, it is understood that such detail is solely for that purpose, and variations can be made therein my those skilled in the art without departing from the spirit and scope of the invention as defined in the claims that follow.

What is claimed:

1. A nanoscale membrane exposed on opposite sides thereof and having an average thickness of less than about 100 nm, a lateral length to thickness aspect ratio that is more than 10,000 to 1, a surface roughness of less than about 1 nm, and wherein the membrane is formed of a semiconductor material selected from the group of silicon, germanium, silicon or germanium alloys, p-doped silicon or germanium, and n-doped silicon or germanium.

2. The nanoscale membrane according to claim 1 wherein the semiconductor material is n-doped or p-doped silicon.

3. The nanoscale membrane according to claim 1 wherein the semiconductor material is in either an amorphous form or a crystalline form.

4. The nanoscale membrane according to claim 1 wherein the membrane is between about 50 and about 100 nm thick.

5. The nanoscale membrane according to claim 1 wherein the membrane is between about 10 and about 50 nm thick.

6. The nanoscale membrane according to claim 1 wherein the membrane is characterized by a surface area up to 10 square millimeters.

7. The nanoscale membrane according to claim 1 wherein the membrane is substantially planar.

8. A structure comprising:
a support having at least one passage extending between opposite surfaces of the support; and
at least one nanoscale membrane according to claim 1 bound at its outer edges to the support, wherein each of the at least one nanoscale membranes confronts a passage.

9. The nanoscale membrane according to claim 1 wherein the membrane comprises a surface roughness of less than about 0.5 nm.

10. The nanoscale membrane according to claim 1 wherein the membrane is less than about 10 nm thick.

11. The nanoscale membrane according to claim 10 wherein the membrane is between about 2 and about 8 nm thick.

12. The nanoscale membrane according to claim 1 wherein the membrane is characterized by an aspect ratio that is more than 50,000 to 1.

13. The nanoscale membrane according to claim 12 wherein the membrane is characterized by an aspect ratio that is more than about 100,000:1.

14. A sensor comprising a membrane according to claim 1.

15. The sensor according to claim 14, wherein the sensor is a pressure sensor, a piezoelectric, or piezoresistive sensor.

16. The nanoscale membrane according to claim 1 wherein the membrane is non-planar.

17. The nanoscale membrane according to claim 16 wherein the membrane comprises a relief pattern formed therein.

18. A method of forming shaped nanoscale products, said method comprising:
providing a nanoscale membrane according to claim 17;
filling the relief pattern of the membrane with a product; and removing the product from the relief pattern of the nanoscale membrane to obtain shaped nanoscale products.

19. The nanoscale membrane according to claim 1 wherein the membrane is substantially transparent to light or electron beam.

20. A device for supporting a product during electron microscopy, wherein the device comprises a membrane according to claim 19.

21. A method of performing transmission electron microscopy comprising:
   providing a sample, to be viewed under transmission electron microscopy, upon the membrane of a device according to claim 20;
   exposing the sample provided upon the membrane to a transmission electron microscope under conditions effective to produce an image of the sample.

22. A nanoscale membrane exposed on opposite sides thereof and having an average thickness of less than about 30 nm, a lateral length to thickness aspect ratio that is more than 10,000 to 1, and wherein the membrane is formed of a semiconductor material selected from the group of silicon, germanium, silicon or germanium alloys, p-doped silicon or germanium, and n-doped silicon or germanium.

23. The nanoscale membrane according to claim 22 wherein the membrane is less than about 10 nm thick.

24. The nanoscale membrane according to claim 22 wherein the semiconductor material is in either an amorphous form or a crystalline form.

25. The nanoscale membrane according to claim 22 wherein the membrane is substantially planar.

26. A structure comprising:
   a support having at least one passage extending between opposite surfaces of the support; and
   at least one nanoscale membrane according to claim 22 bound at its outer edges to the support, wherein each of the at least one nanoscale membranes confronts a passage.

27. The nanoscale membrane according to claim 22 wherein the membrane is characterized by an aspect ratio that is more than 50,000 to 1.

28. The nanoscale membrane according to claim 27 wherein the membrane is characterized by an aspect ratio that is more than 100,000 to 1.

29. A sensor comprising a membrane according to claim 22.

30. The sensor according to claim 29, wherein the sensor is a pressure sensor, a piezoelectric, or piezoresistive sensor.

31. A device for supporting a product during electron microscopy, wherein the device comprises a membrane according to claim 22, wherein the membrane is substantially transparent to light or electron beam.

32. A method of performing transmission electron microscopy comprising:
   providing a sample, to be viewed under transmission electron microscopy, upon the membrane of a device according to claim 31;
   exposing the sample provided upon the membrane to a transmission electron microscope under conditions effective to produce an image of the sample.

* * * * *